United States Patent [19]

Vora

[11] Patent Number: 4,545,113
[45] Date of Patent: Oct. 8, 1985

[54] PROCESS FOR FABRICATING A LATERAL TRANSISTOR HAVING SELF-ALIGNED BASE AND BASE CONTACT

[75] Inventor: Madhukar B. Vora, Los Gatos, Calif.

[73] Assignee: Fairchild Camera & Instrument Corporation, Mountain View, Calif.

[21] Appl. No.: 527,146

[22] Filed: Aug. 29, 1983

Related U.S. Application Data

[62] Division of Ser. No. 199,771, Oct. 23, 1980, abandoned.

[51] Int. Cl.[4] .................. H01L 21/22; H01L 21/265
[52] U.S. Cl. ........................................ 29/578; 29/580; 29/591; 148/187
[58] Field of Search ..................... 29/578, 580, 591; 148/187

[56] References Cited

U.S. PATENT DOCUMENTS

| | | | |
|---|---|---|---|
| 3,484,662 | 12/1969 | Hagon | 357/35 X |
| 3,598,664 | 8/1971 | Kilby | 148/175 |
| 3,648,125 | 3/1972 | Peltzer | 148/175 |
| 3,660,732 | 5/1972 | Allison | 357/35 |
| 3,739,238 | 6/1973 | Hara | 357/43 |
| 3,890,632 | 6/1975 | Ham et al. | 357/23 TF |
| 3,919,005 | 11/1975 | Schinella et al. | 148/175 |
| 3,945,857 | 3/1976 | Schinella et al. | 148/175 |
| 4,109,272 | 8/1978 | Herbst | 357/35 |
| 4,124,933 | 11/1978 | Nicholas | 29/578 |
| 4,298,402 | 11/1981 | Hingarh | 148/1.5 |
| 4,329,706 | 5/1982 | Crowder et al. | 357/71 |

Primary Examiner—George T. Ozaki
Attorney, Agent, or Firm—Carl L. Silverman; David H. Carroll; Robert C. Colwell

[57] ABSTRACT

A lateral transistor structure having a self-aligned base and base contact is provided, together with a method for fabricating such a structure in which the base width is controlled by lateral diffusion of an impurity through a polycrystalline silicon layer. The resulting zone of impurity changes the etching characteristics of the layer and permits use of a selective etchant to remove all of the layer except the doped portion. The doped portion may then be used as a mask to define the base electrical contact, which in turn is used to provide a self-aligned base for the transistor. Dopants introduced on opposite sides of the base electrical contact create the emitter and collector.

10 Claims, 8 Drawing Figures

PROCESS FOR FABRICATING A LATERAL TRANSISTOR HAVING SELF-ALIGNED BASE AND BASE CONTACT

This is a division of application Ser. No. 199,771, filed Oct. 23, 1980, now abandoned.

BACKGROUND OF THE INVENTION

1. Field of the Invention

This invention relates to a lateral transistor structure and to processes for fabricating it, and in particular to a lateral transistor structure having a self-aligned base/base contact and a very narrow base width compared to existing lateral transistors.

2. Prior Art

Most present high performance transistor structures rely upon vertical transistors in which the active junctions are formed parallel to the surface of the silicon, and the emitter to collector currents therefore flow vertically. Such structures provide precise yet straightforward control of the transistor base width by virtue of the diffusion processes utilized in fabricating them. Existing diffusion processes permit manufacture of vertical bipolar transistors having a base width of 5,000 angstroms. Such transistors have a gain of approximately 100 and operate at frequencies up to approximately one gigaHertz.

The maximum switching frequency for such transistors has been limited by primarily two parameters—the total base resistance and the collector-base capacitance. Nonetheless using three micron integrated circuit layout rules these parameters have been low enough to permit switching speeds on the order of 1 to 3 nanoseconds. As integrated circuit processing technology moves closer to permitting 1 micron layout rules, very shallow junctions, and very narrow base widths, it is expected that transistors may usefully operate at frequencies of up to 10 gigaHertz. At such high frequencies switching performance will be almost completely dependent upon base resistance and collector-base capacitance.

Lateral transistors, of course, are well known. Different techniques of integrated circuit manufacture have been used to fabricate such transistors. One well known technique is to use a double diffusion process, for example, as taught by Schinella and Anthony in U.S. Pat. Nos. 3,919,005 or 3,945,857. Using this process, the transistor base is created by laterally and vertically diffusing into an epitaxial semiconductor layer formed over a buried layer, a base impurity of the desired conductivity type. Much of the base is then counter doped with a second diffusion of opposite conductivity type for the emitter or collector of the transistor. Suitably controlled, the second diffusion overdopes all but a narrow portion of the base impurity, resulting in the base width of the transistor being that portion of the structure not overdoped by the second diffusion. The semiconductor substrate forms the other of the collector or emitter. Contact to the base is made by the buried layer, while contact to the buried layer is made elsewhere by a doped region extending through the epitaxial layer to the buried layer. The doped region is the same conductivity type as the buried layer.

A second technique for fabricating lateral transistors in integrated circuit structures has been to deposit a line of masking material on the surface of an epitaxial layer and then diffuse impurities for the collector and emitter toward each other in the substrate from opposite sides of the line. The base region will be the portion of the epitaxial layer between the diffusion fronts of the emitter and the collector. Electrical contact to the base is made through a buried layer. Unfortunately, all of the above techniques suffer from several disadvantages. Each technique, because of the buried layer and the need to make electrical contact to it, creates a transistor structure which occupies an undesirably large area on the wafer. None of the techniques allows sufficient control over the processes involved to achieve base widths less than 1 micron. Further, diffusing the collector-emitter impurities for even slightly too long will overdope the semiconductor material which would other-wise form the base, and destroy the function of the transistor.

SUMMARY OF THE INVENTION

This invention provides a lateral transistor structure having a self-aligned base/base contact and a narrower base width than present lateral transistors. The narrower base allows virtually all of the electrons injected by the emitter to be transported across the base to the collector, and reduces the transit time for the injected electrons. This increases the speed at which the transistor may change states. Transistors fabricated according to this invention may have base widths on the order of 2,000 to 5,000 angstroms, switch in less than 100 picoseconds, and have collector-base capacitances on the order of 0.001 picofarads. In one embodiment the integrated circuit structure of the invention includes an insulating substrate, a semiconductor layer of first conductivity type on the substrate, the semiconductor layer having a region of opposite conductivity type therein extending through the layer, and a conductive region overlying substantially all of the region of opposite conductivity and none of the first conductivity type.

Typically the region of opposite conductivity type will divide the semiconductor layer into two non-contiguous regions of first conductivity type, and an insulating region will surround the conductive region except where the conductive region contacts the region of opposite conductivity type. In the preferred embodiment the semiconductor layer will be doped with N conductivity type impurity, while the conductive material will include a lower layer of doped polycrystalline silicon and an upper layer of a metal silicide.

A method of fabricating the structure includes the steps of forming a first layer on an underlying semiconductor substrate, and forming a second layer on the first layer, the second layer having an edge; defining a zone of impurity in the second layer by introducing a first impurity into the second layer through the edge; removing the first layer except where it is overlaid by the zone of impurity; and introducing a second impurity into the substrate except where the substrate is overlaid by the first layer. In some embodiments of the process of the invention each of the first and the second layers themselves will be made up of two or more layers. To describe these embodiments the individual layers within either the first or second layers will be referred to as "regions", although as will be explained each region may be a layer.

More specifically, in one embodiment of the invention, the underlying semiconductor substrate is P conductivity type silicon, and the first layer itself comprises three regions formed atop each other—a first region of polycrystalline silicon disposed directly on the semiconductor substrate, a region of a metal silicide formed upon the surface of the polycrystalline silicon, and a first region of silicon dioxide formed atop the metal silicide. The second layer, which is formed upon the surface of the first layer also comprises a sandwich type structure including a second region of polycrystalline silicon and a second region of silicon dioxide. Thus, in one embodiment of the invention five successive regions are formed on the semiconductor substrate; from bottom to top being polycrystalline silicon, a metal silicide, silicon dioxide, a second layer of polycrystalline silicon, and a second layer of silicon dioxide.

Using well known photolithographic integrated circuit processes, an edge in the second layer (the polycrystalline-silicon dioxide sandwich) is defined by a masking and chemical etching procedure. In the resulting structure, the second region of polycrystalline silicon is exposed only along this edge, with its upper surface being protected by the second region of silicon dioxide and its lower surface being protected by the first layer.

A suitable impurity is then laterally diffused into the exposed edge of the second region of polycrystalline silicon to define the zone of impurity. Using a selective etchant, all of the second region of silicon dioxide and the second region of polycrystalline silicon are removed, except for that portion of the second region of polycrystalline silicon doped by the laterally diffused impurity.

Using this zone of doped polycrystalline silicon as a mask, exposed regions of the first region of silicon dioxide in the first layer are removed. Next, the thereby exposed portions of the regions of metal silicide and then the exposed portions of the polycrystalline silicon in the first layer are removed except where they are beneath the zone of doped polycrystalline silicon. By using an isotropic chemical etchant to remove the silicide and polycrystalline silicon, an overhang of the first region of silicon dioxide over these layers is created. A thin layer of an oxide of silicon may then be grown across the surface of the semiconductor substrate and along the edges of the polycrystalline silicon. All of this oxide, except those portions beneath the overhang of the first region of silicon dioxide, may then be removed by plasma etching, thereby permitting introduction of a second impurity into the semiconductor substrate. The regions of second impurity will define the emitter and collector of the transistor, while the intervening region defines the base. The overlying polycrystalline-metal silicide regions provide electrical contact to the base.

DETAILED DESCRIPTION

Figure 1:
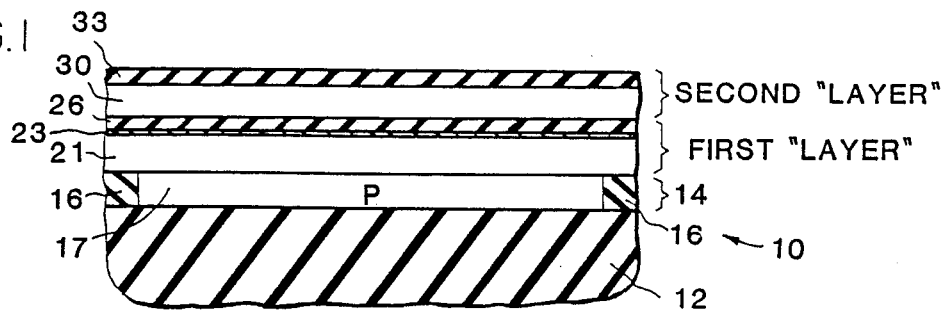
FIG. 1 is a cross-sectional view of a semicondutor substrate after formation of the first and second layers.

FIG. 1 is a cross-sectional view of an integrated circuit structure 10 which may be fabricated using well known techniques. On an insulating substrate 12 a layer of semiconductor material 14 is formed. Insulating substrate 12 may be any material which is not electrically conductive, and in one embodiment is a silicon dioxide layer formed on the upper surface of other semiconductor materials (not shown). Layer 14 will typically be monocrystalline silicon. Using known masking and etching techniques, for example, as taught by Peltzer in U.S. Pat. No. 3,648,125, regions 16 of epitaxial layer 14 are converted to silicon dioxide. Then by ion implantation or other known integrated circuit process technology, a portion, 17 of layer 14 is uniformly doped with P-conductivity type impurity, for example, boron at a concentration of $10^{17}$ atoms per cubic centimeter. In the preferred embodiment, layer 14 is 5,000 angstroms thick and is formed using any known technique, for example, silicon on sapphire deposition or by depositing polycrystalline silicon on silicon dioxide and then laser annealing to form single crystal silicon.

On the upper surface of semiconductor material 14, a first region of polycrystalline silicon 21 is deposited. Silicon layer 21 will typically be 3000 angstroms thick and formed by chemical vapor deposition processing. P+ impurity is then implanted in polycrystalline silicon 21, for example, using boron at a concentration of $10^{20}$ atoms per cubic centimeter. Such implantation typically will be shallow, for example, being performed at 20 to 30 kev. On the upper surface of region 21, a metal silicide 23, for example tungsten silicide, is formed by chemical vapor deposition.

On the upper surface of silicide 23, a layer of insulating material 26, typically silicon dioxide, is formed. Layer 26 will be approximately 1000 angstroms thick and fabricated by thermal oxidation of silicide 23, for example, at a temperature between 800° C., and 1000° C., or by vapor deposition of silicon dioxide. On silicon dioxide 26 a second region 30 of polycrystalline silicon is formed. This layer will be approximately 3000 angstroms thick and formed using the same process as region 21. On the upper surface of the second polycrystalline silicon region 30, a region of silicon dioxide 33 is formed. This layer typically will be 2000 angstroms thick and formed by oxidizing polycrystalline silicon 30 at a temperature of 1000° C. for one hour.

Figure 2:
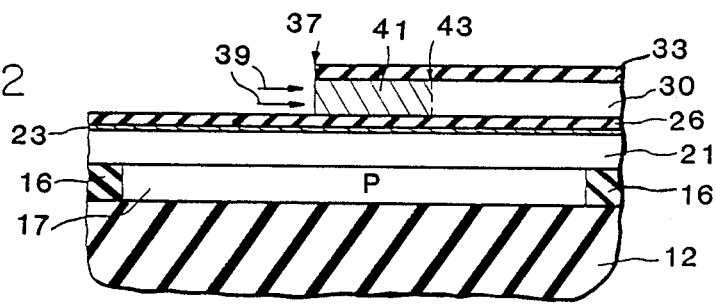
FIG. 2 shows the same cross-section after definition of an edge in the second layer.

Using well known photolithographic techniques and a first mask, the structure in FIG. 2 may be obtained from that shown in FIG. 1. The first mask will define an edge 37 in silicon dioxide layer 33 and polycrystalline silicon layer 30. As will be explained, edge 37 will be used to define one edge of the base region of the lateral transistor to be formed in P-type silicon region 17.

As shown schematically in FIG. 2, suitable impurities 39, for example boron, are diffused laterally into layer 30. This may be accomplished using a well-known diffusion process carried out at a temperature of approximately 1000° C. The boron 39 will dope the polycrystalline silicon 30 to an impurity concentration of $10^{20}$ atoms per cubic centimeter. Because silicon dioxide layers 26 and 33 are relatively impervious to impurity diffusion, the boron 39 will diffuse into layer 30 and create a doped region 41. The diffusion front of impurity 39 in layer 30 is designated by dashed line 43 in FIG. 2. A substantial advantage of the invention is that the lateral position of front 43 with respect to edge 37 may be precisely controlled. For example, at a temperature of 1000° C. and a boron source concentration of $10^{20}$ atoms per cubic centimeter, the diffusion front 43 will advance at a rate of approximately 1 micron per hour. This relatively slow advance of front 43 permits extremely accurate control of the width of the doped region 41 in layer 30. For example, in some embodiments, region 41 will be between 2,000 and 5,000 angstroms wide. As will be evident, accurate control of the width of doped region 41 permits accurate control of the width of the electrical connection to the base of the lateral transistor, and correspondingly, accurate control of the width of the base of the lateral transistor.

Figure 3:
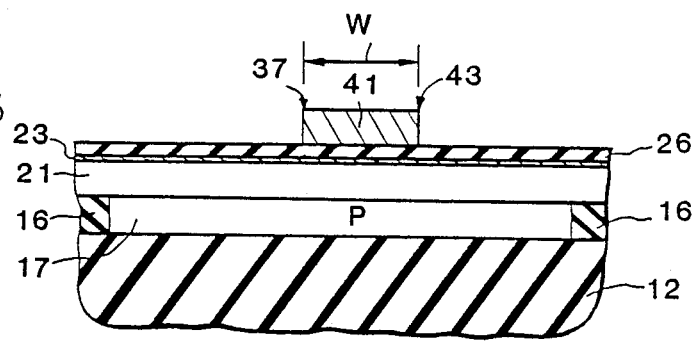
FIG. 3 shows a subsequent cross-section after removal of all of the second layer except the doped portion.

As shown in FIG. 3, silicon dioxide layer 33 and the regions of silicon layer 30 not doped by impurity 39 are next removed. Oxide layer 33 may be removed using conventional photolithographic technology and then an etchant, typically 10 parts water, 1 part hydrofluoric acid. This solution will also partially or completely remove the oxide layer 26 on the left side of doped polycrystalline silicon 41 not protected by overlying region 30. Removal of part or all of layer 26 will not affect the final structure because any remaining portions of the layer 26 are later removed anyway (See FIG. 4). The undoped portions of layer 30 may be removed using a known chemically selective etchant which attacks the undoped portions of layer 30 but not the doped portion 41. The structure which results after removal of oxide 33 and the undoped portions of layer 30 is shown in FIG. 3. The result of the process sequence through this step has been to create a region of doped polysilicon 41 having a precisely controlled width W as shown.

The doped polycrystalline silicon region 41 is then used as a mask for removal of oxide 26. In one embodiment of the invention, oxide 26 is removed using a known plasma etch process having parameters suitable for removing a layer of silicon dioxide approximately 1000 angstroms thick. The appearance of the structure after removal of the exposed oxide 26 is shown in FIG.

Figure 4:
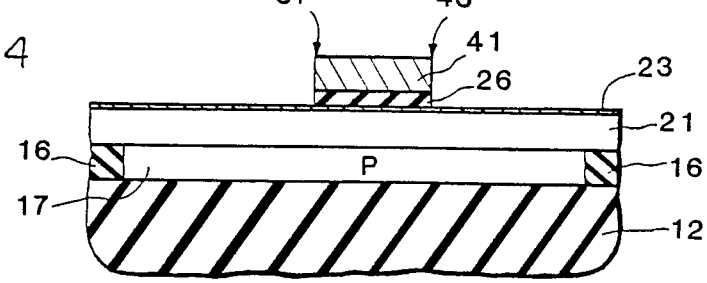
FIG. 4 shows a subsequent cross-section after using the second layer as a mask for removal of a portion of the first layer.
Figure 5:
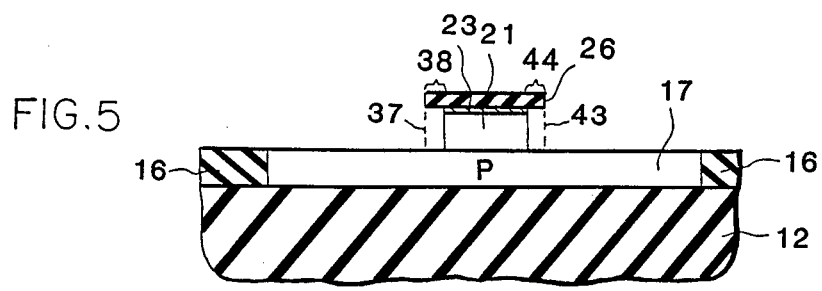
FIG. 5 shows a subsequent cross-section after removal of all of the first layer except for that portion underlying the doped portion of the second layer.

The structure of FIG. 4 is then further plasma etched to remove the exposed silicide 23 and the thereby exposed portions of the first region of polycrystalline silicon 21. A suitable plasma process for accomplishing this is the known planar plasma etching process. At the completion of the plasma etching, edges 37 and 44 will be defined in the regions 21 and 23. These edges are shown by the dashed lines in FIG. 5. The resulting structure is then chemically etched, for example, with a mixture of hydrofluoric and nitric acids, to undercut silicon dioxide layer 26, creating overhanging regions 38 and 44. This structure is depicted in FIG. 5. An overhang of 1000 angstroms has been found suitable.

Figure 6:
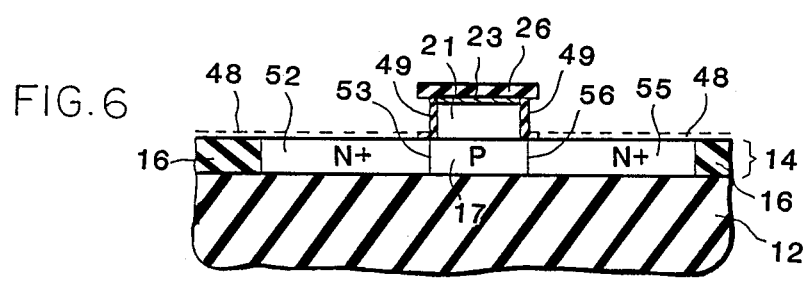
FIG. 6 shows a subsequent cross-section after formation of oxide along the edges of the remaining first layer.

A layer of silicon dioxide, comprising regions 48 and 49 is then grown across the surface of the silicon layer 14, including any portion of the P-type region 17. In one embodiment, layer 48 is 1000 angstroms thick and is formed by heating the structure shown in FIG. 5 in an atmosphere containing oxygen to a temperature of 1000° C. for 30 minutes. This oxidation process will also create regions 49 shown in FIG. 6, because the exposed edges of silicon region 21 will also oxidize. A plasma etch using a planar plasma etching procedure may then be used to remove the undesired portions 48 of the silicon dioxide. During this process, silicon dioxide layer 26 will serve as a mask to present the removal of oxide regions 49. Next, as also shown in FIG. 6, N+ conductivity type impurities, for example phosphorus, may be diffused or implanted into the surface of region 17 to create N+ type regions 52 and 55 which extend to the bottom of layer 17, that is its interface with layer 12, and to permit lateral diffusion of the N type impurity to create the PN junctions 53 and 56 beneath protective oxide regions 49. In one embodiment, regions 52 and 55 have impurity concentrations of approximately $10^{20}$ atoms per cubic centimeter.

Figure 7:
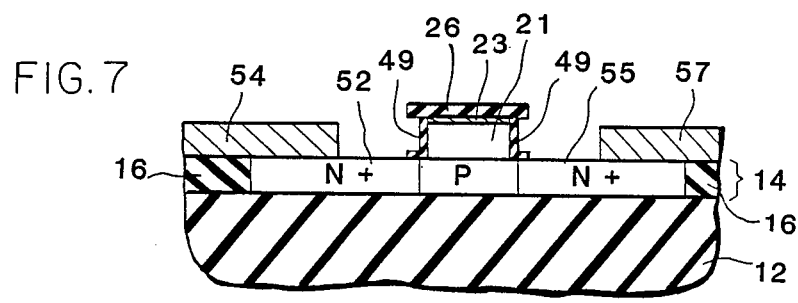
FIG. 7 shows a subsequent cross-section after formation of electrical contacts to the emitter and collector.

Finally, as shown in FIG. 7, using well-known techniques, electrical connections 54 and 57 may be provided to the N+ type regions 52 and 55. Such connections may be fabricated using aluminum, alloys of aluminum with copper and/or silicon, or with other known integrated circuit metal systems, for example, tungsten-titanium alloys. Also, using known technology, the surface of the structure shown in FIG. 7 may be protected by forming a layer of vapor deposited silicon dioxide (not shown), or other suitable passivating material across its upper surface.

Figure 8:
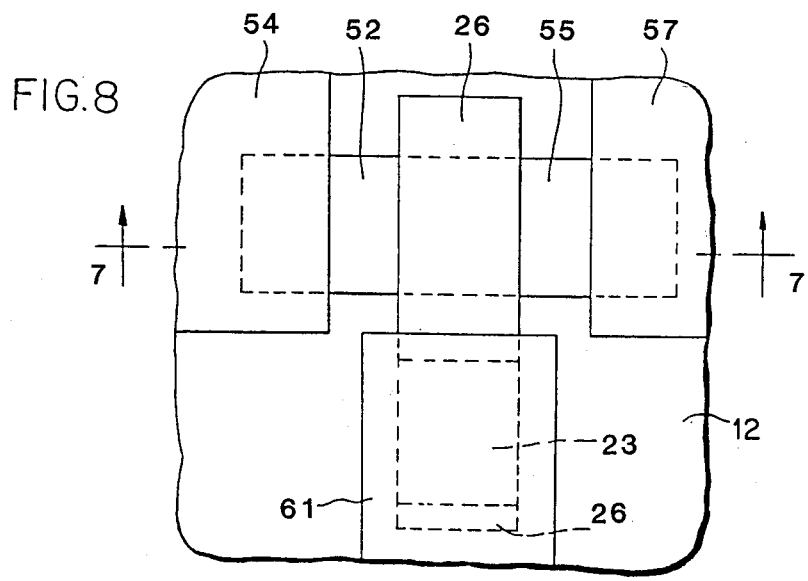
Fig. 8 is a top view of the structure shown in FIG. 7.

FIG. 8 is a top view of the structure shown in FIG. 7 with corresponding elements given the same reference numerals. Region 61, also metal, is used to make an electrical connection to the doped polycrystalline silicon base contact 21 by electrically connecting to silicide layer 23. That is, in FIG. 8, the region designated 23 has had the overlying oxide 26 removed to enable metal 61 to directly contact silicide 23.

The lateral transistor structure of this invention offers several advantages over existing structures. In particular, the structure provides a very narrow base having a self-aligned base contact. This eliminates the need for a buried layer and for a doped region to provide a connection between the buried layer and the surface of the integrated circuit. The substantial size reduction in the resulting lateral bipolar transistor allows higher packing densities and lower cost. The elimination of any extrinsic base region (the base contact is formed over substantially all of the base) allows faster operating speeds. Further, the intrinsic base resistance is very small because the width of the emitter may be determined by the thickness of the epitaxial silicon layer 14. Layers such as layer 14 may be readily fabricated less than 1 micron thick. In addition, there is no collector base junction beneath the extrinsic base, thereby reducing the collector-base capacitance. The area of the intrinsic base-collector junction is also small because this area depends upon the thickness of layer 14. The base width of the resulting structure is accurately controllable because the extent of the lateral diffusion of P dopants in the polycrystalline layer 30 may be accurately controlled.

The method of fabricating a lateral transistor described above provides several advantages over existing methods of fabricating such transistors. For example, only two masks are required prior to depositing metal and defining interconnections. The self-aligning electrical contact to the base region, the base region itself, and the PN junctions between the collector and base and between the emitter and base are all formed independent of alignment tolerances.

Although the invention has been described with reference to a specific embodiment, the description is illustrative of the invention and is not to be construed as limiting the invention. Various modifications and applications may occur to those skilled in the art without departing from the true spirit and scope of the invention as defined by the appended claims. For example, the structure of the invention may be fabricated using any method for defining a narrow base. One such alternate technique is to use known electron beam mask making apparatus or to expose photoresist directly on the wafer with an electron beam.

I claim:

1. A process for fabricating a lateral bipolar transistor with self-aligned low resistance base contact comprising:

sequentially depositing on an underlying first conductivity type layer of semiconductor material a first polycrystalline silicon layer, then a metal silicide layer;

forming on the metal silicide layer a three-layer sandwich having a lower, a middle and an upper layer, the upper and lower layers of the three-layer sandwich being substantially impervious to a selected impurity, but not the middle layer;

removing a portion of the upper and the middle layers to define an edge;

introducing selected impurity into the middle layer through the edge to define a zone of impurity in the middle layer;

removing all of the upper layer, then all of the middle layer except for the zone of impurity;

removing all of the lower layer and the metal silicide layer except where each of these is overlaid by the zone of impurity, thereby to define a remaining region of the lower layer;

removing all of the metal silicide layer except that portion overlaid by the remaining region, then removing all of the zone of impurity and all of the first polycrystalline silicon layer except that portion of the first polycrystalline silicon layer overlaid by the remaining region to thereby provide a metal silicide/polycrystalline silicon contact to the first conductivity type layer of semiconductor material;

laterally etching the metal silicide layer and the first polycrystalline silicon layer to undercut the lower layer;

forming insulating material over all of the first polycrystalline silicon layer, the metal silicide and the first conductivity type layer of semiconductor material except where the first conductivity type layer of semiconductor material is overlaid by the first polycrystalline silicon layer;

removing all of the insulating material except that masked by the lower layer; and using the lower layer as a mask, introducing opposite conductivity type impurity into the first conductivity type layer of semiconductor material to thereby form a collector and an emitter of a lateral bipolar transistor.

2. A process as in claim 1 wherein the middle layer comprises polycrystalline silicon.

3. A process as in claim 2 wherein the step of removing all of the upper layer, then all of the middle layer except the zone of impurity comprises etching the middle layer with an etchant which attacks undoped polycrystalline silicon but not doped polycrystalline.

4. A process as in claim 3 wherein each of the lower and the upper layers comprises silicon dioxide.

5. A process as in claim 1 wherein the first conductivity type comprises P conductivity type.

6. A process as in claim 5 wherein the selected impurity comprises boron.

7. A process as in claim 6 wherein the metal silicide comprises tungsten silicide.

8. A process as in claim 1 wherein the step of forming on the metal silicide layer a three-layer sandwich having a lower, a middle and an upper layer comprises:

oxidizing the metal silicide layer to form the lower layer;

depositing polycrystalline silicon to form the middle layer; and oxidizing the polycrystalline silicon to form the upper layer.

9. A process as in claim 8 wherein the step of removing a portion of the upper and the middle layers to define an edge comprises masking the upper layer, then etching it.

10. A process as in claim 9 wherein the step of forming insulating material over all of the first polycrystalline silicon layer, the metal silicide and the first conductivity type layer of semiconductor material comprises oxidizing the first polycrystalline silicon layer, the metal silicide and the first conductivity type layer of semiconductor material.

* * * * *